(12) United States Patent
Lin et al.

(10) Patent No.: US 9,306,032 B2
(45) Date of Patent: Apr. 5, 2016

(54) METHOD OF FORMING SELF-ALIGNED METAL GATE STRUCTURE IN A REPLACEMENT GATE PROCESS USING TAPERED INTERLAYER DIELECTRIC

(71) Applicant: UNITED MICROELECTRONICS CORP., Hsin-Chu (TW)

(72) Inventors: Ching-Ling Lin, Kaohsiung (TW);
Chih-Sen Huang, Tainan (TW);
Po-Chao Tsao, New Taipei (TW);
Ching-Wen Hung, Tainan (TW);
Jia-Rong Wu, Kaohsiung (TW);
Chien-Ting Lin, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 57 days.

(21) Appl. No.: 14/062,909

(22) Filed: Oct. 25, 2013

(65) Prior Publication Data
US 2015/0118835 A1 Apr. 30, 2015

(51) Int. Cl.
*H01L 21/3205* (2006.01)
*H01L 29/66* (2006.01)

(52) U.S. Cl.
CPC .... *H01L 29/66477* (2013.01); *H01L 29/66545* (2013.01)

(58) Field of Classification Search
None
See application file for complete search history.

(56) References Cited

U.S. PATENT DOCUMENTS

| 5,482,900 | A * | 1/1996 | Yang | 438/623 |
| 5,960,270 | A * | 9/1999 | Misra | H01L 21/2257 257/E21.151 |
| 6,043,138 | A | 3/2000 | Ibok | |
| 6,492,216 | B1 | 12/2002 | Yeo | |
| 6,921,963 | B2 | 7/2005 | Krivokapic | |
| 7,087,477 | B2 | 8/2006 | Fried | |
| 7,091,551 | B1 | 8/2006 | Anderson | |
| 7,247,887 | B2 | 7/2007 | King | |
| 7,250,658 | B2 | 7/2007 | Doris | |
| 7,309,626 | B2 | 12/2007 | Ieong | |
| 7,352,034 | B2 | 4/2008 | Booth, Jr. | |
| 7,470,570 | B2 | 12/2008 | Beintner | |
| 7,517,746 | B2 * | 4/2009 | Lin | H01L 21/28079 257/E21.409 |
| 7,531,437 | B2 | 5/2009 | Brask | |
| 7,569,857 | B2 | 8/2009 | Simon | |
| 2003/0003666 | A1 * | 1/2003 | Iriyama et al. | 438/275 |
| 2004/0195624 | A1 | 10/2004 | Liu | |
| 2005/0051825 | A1 | 3/2005 | Fujiwara | |
| 2006/0099830 | A1 | 5/2006 | Walther | |
| 2006/0286729 | A1 | 12/2006 | Kavalieros | |
| 2007/0108528 | A1 | 5/2007 | Anderson | |
| 2007/0158756 | A1 | 7/2007 | Dreeskornfeld | |
| 2008/0157208 | A1 | 7/2008 | Fischer | |

(Continued)

*Primary Examiner* — Benjamin Sandvik
*Assistant Examiner* — Herve Assouman
(74) *Attorney, Agent, or Firm* — Winston Hsu; Scott Margo

(57) ABSTRACT

A method for manufacturing a semiconductor device includes following steps. A substrate having at least a transistor embedded in an insulating material formed thereon is provided. The transistor includes a metal gate. Next, an etching process is performed to remove a portion of the metal gate to form a recess and to remove a portion of the insulating material to form a tapered part. After forming the recess and the tapered part of the insulating material, a hard mask layer is formed on the substrate to fill up the recess. Subsequently, the hard mask layer is planarized.

13 Claims, 6 Drawing Sheets

(56) References Cited

U.S. PATENT DOCUMENTS

| | | |
|---|---|---|
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0189847 A1* | 8/2011 | Tsai ................. H01L 21/28 438/595 |
| 2012/0139061 A1* | 6/2012 | Ramachandran . H01L 21/76895 257/410 |
| 2012/0139062 A1 | 6/2012 | Yuan et al. |
| 2012/0175711 A1* | 7/2012 | Ramachandran . H01L 21/76897 257/383 |
| 2012/0217590 A1* | 8/2012 | Babich et al. ................. 257/410 |
| 2013/0181265 A1 | 7/2013 | Grasshoff et al. |

* cited by examiner

US 9,306,032 B2

METHOD OF FORMING SELF-ALIGNED METAL GATE STRUCTURE IN A REPLACEMENT GATE PROCESS USING TAPERED INTERLAYER DIELECTRIC

BACKGROUND OF THE INVENTION

1. Field of the Invention

The invention relates to a method for manufacturing a semiconductor device, and more particularly, to a method for manufacturing a semiconductor device having a metal gate.

2. Description of the Prior Art

In the integrated circuit (IC), electrical connection between different semiconductor devices are constructed by contact structures such as contact plugs and interconnection structures. However, along with the miniaturization of the IC, reduction of the feature size, and progress in fabrication of semiconductor device, the line width of interconnections and the feature size of semiconductor devices have been continuously shrunk. With this trend, any misalignment occurs at contact plugs fabrication process may cause contact plug shift issue and even cause short circuit within a device or between devices. In one circumstance that a gate structure and a source/drain of one device are electrically connected due to contact plug shift, a short circuit occurs within the device and thus the device is failed. In another circumstance that the short circuit occurs at different devices, the whole IC may be failed.

Therefore, a method for manufacturing a semiconductor device that is able to prevent device failure due to contact plug shift issue is still in need.

SUMMARY OF THE INVENTION

To solve the issues mentioned above, the present invention provides a method for manufacturing a semiconductor device. According to the present method, a substrate having at least a transistor embedded in an insulating material formed thereon is provided. The transistor includes a metal gate. Next, an etching process is performed to remove a portion of the metal gate to form a recess and to remove a portion of the insulating material to form a tapered part. After forming the recess and the tapered part of the insulating material, a hard mask layer is formed on the substrate to fill up the recess. Subsequently, the hard mask layer is planarized.

According to the method for manufacturing the semiconductor device provided by the present invention, the recess and the tapered part of the insulating material are formed by the etching process. More important, the recess includes an opening larger than a bottom itself due to the tapered part of the insulating material. Therefore, the hard mask layer subsequently formed to fill the recess obtains a width larger than a width of the metal gate. Therefore the metal gate is protected from being exposed in following process such as contact hole etch process. Consequently, short circuit between the metal gate and the source/drain caused by contact plug misalign or contact plug shift is avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a method for manufacturing a semiconductor device provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIGS. 7-12 are schematic drawings illustrating a method for manufacturing a semiconductor device provided by a second preferred embodiment of the present invention, wherein FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, and FIG. 12 is a schematic drawing in a step subsequent to FIG. 11.

DETAILED DESCRIPTION

Figure 1:
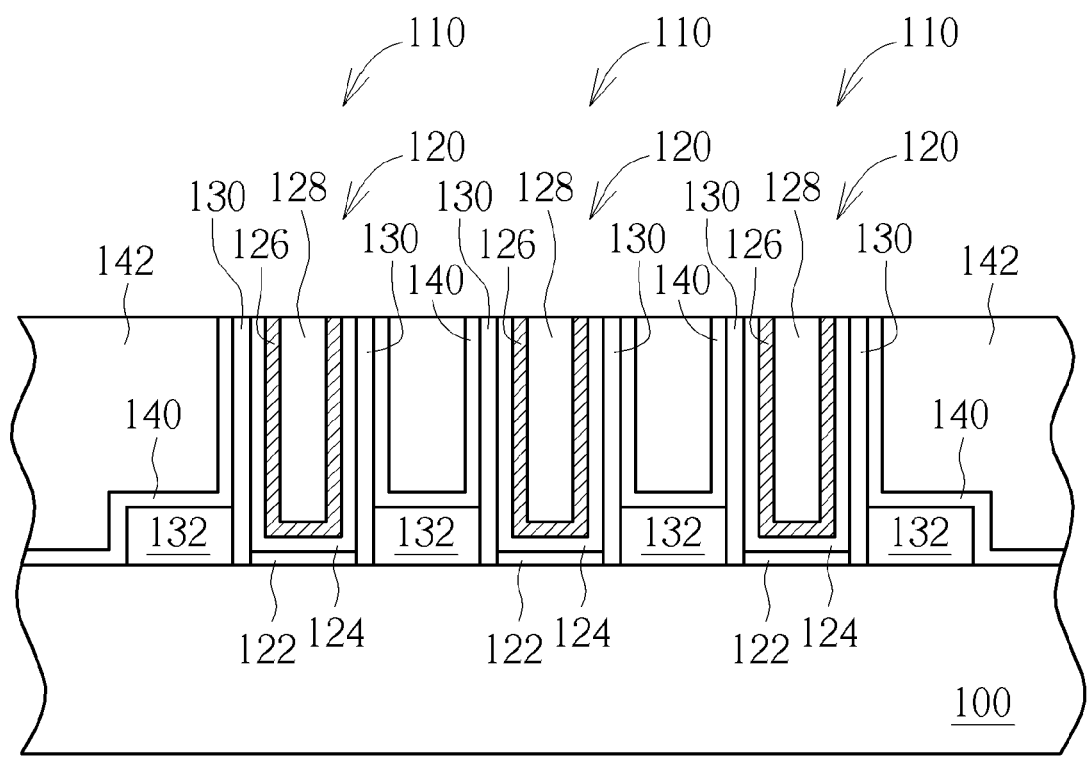

Please refer to FIGS. 1-6, which are schematic drawings illustrating a method for manufacturing a semiconductor device provided by a first preferred embodiment of the present invention. As shown in FIG. 1, the preferred embodiment first provides a substrate 100 such as a silicon substrate, a silicon-containing substrate, or a silicon-on-insulator (SOI) substrate. A plurality of transistors 110 are formed on the substrate 100. The transistors 110 respectively include a metal gate 120, light doped drains (not shown), a spacer 130, and a source/drain 132. Salicides (not shown) can be formed on the source/drain 132. Additionally, selective strain scheme (SSS) is involved in the preferred embodiment. As shown in FIG. 1, a selective epitaxial growth (SEG) method is performed to form an epitaxial source/drain 132. The epitaxial source/drain 132 can include SiGe or SiC, depending on the conductivity type of the transistor 110. Also, a contact etch stop layer (hereinafter abbreviated as CESL) 140 and an inter-layer dielectric (hereinafter abbreviated as ILD) layer 142 are formed on the substrate 100.

The metal gate 120 includes an interfacial layer (IL) layer 122, a high dielectric constant (hereinafter abbreviated as high-k) gate dielectric layer 124, a multiple work function metal layer 126, and a gap-filling metal layer 128. In the preferred embodiment, the high-k gate dielectric layer 124 includes high-k materials such as rare earth metal oxide. The high-k gate dielectric layer 124 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). Additionally, though the preferred embodiment adopts high-k last approach, those skilled in the art would easily realize the preferred embodiment can be integrated with high-k first process.

Furthermore, the multiple work function metal layer 126 includes at least a work function metal layer, which provides work function required by the transistor 110. For example, when the transistor 110 is a p-typed transistor, the work function metal layer 106 is a p-metal layer with a work function between 4.8 and 5.2. On the other hand, when the transistor 110 is an n-typed transistor, the work function metal layer is an n-metal layer with a work function between 3.9 and 4.3. The multiple work function metal layer 126 can also include any conductive material required in the metal gate approach, such as a barrier layer and/or an etch stop layer, but not limited to this. The gap-filling metal layer 128 includes metal material having superior gap-filling ability, such as aluminum (Al) or tungsten (W), but not limited to this.

It is well-known to those skilled in the art, that after forming the gap-filling metal layer 128, a planarization process is performed to remove superfluous metal layers and high-k gate dielectric layer from the substrate 100. Consequently, the metal gates 120 are formed and an even surface is obtained. As shown in FIG. 1, the ILD layer 142, the CESL 140, the spacer 130, and a top of the metal gates 120 are exposed at this even surface. It should be easily realized that since the ILD layer 142, the CESL 140, and the spacer 130 are all formed of insulating material, the ILD layer 142, the CESL 140, and the spacer 130 are taken as an insulating material in which the transistors 110 are embedded.

Figure 2:
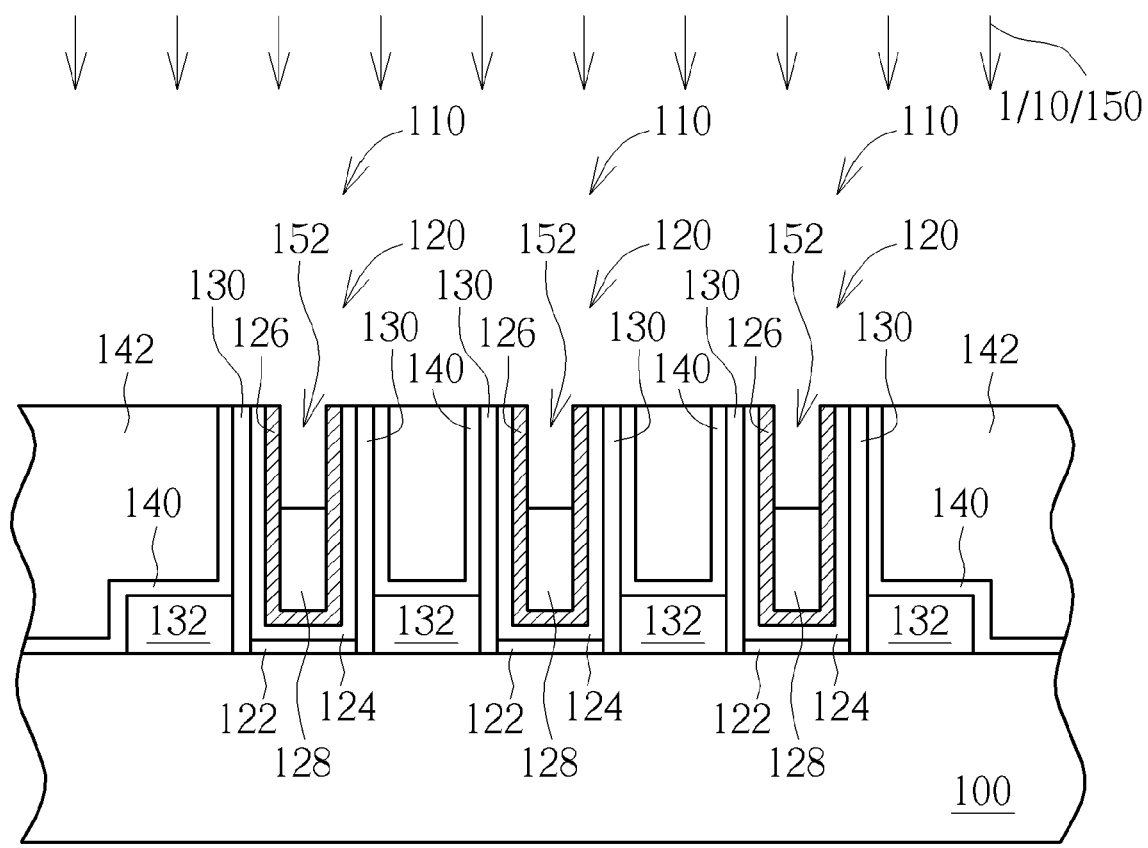

Please refer to FIG. 2. Next, a first metal etching step 150 is performed to remove a portion of the gap-filling metal layer 128, and thus a first recess 152 is formed in each metal gate 120. The first metal etching step 150 includes a dry etching process. For example, the first metal etching step 150 includes $Cl_2$ and $SF_6$, but not limited to this. As shown in FIG. 2, the multiple work function metal layer 126 serves as sidewalls of the recess 152 and the gap-filling metal layer 128 serves as a bottom of the recess 152.

Figure 3:
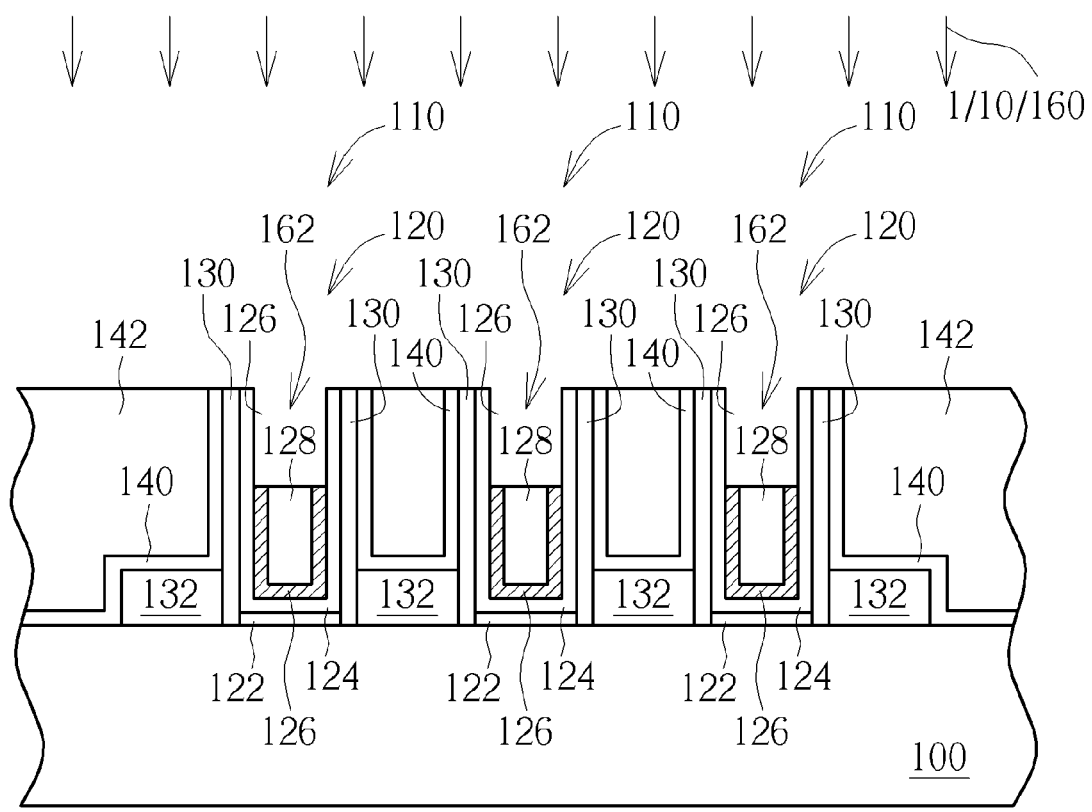

Please refer to FIG. 3. After forming the first recess 152, a second metal etching step 160 is performed to remove a portion of the multiple work function metal layer 126, and thus a second recess 162 is formed in each metal gate 120. The second metal etching step 160 includes a dry etching process. For example, the second metal etching step 160 includes $Cl_2$ and $BCl_3$, but not limited to this. It is noteworthy that the first metal etching step 150 and the second metal etching step 160 are performed in-situ, therefore the first metal etching step 150 and the second metal etching step 160 are taken as two steps of one metal etching process 10. More important, since the multiple work function metal layer 126 serves as the sidewalls of the first recess 152, the second recess 162 is formed as to widen the first recess 152 by the second metal etching step 160. Consequently, an opening width of the second recess 162 is larger than an opening width of the first recess 152. As shown in FIG. 3, the high-k gate dielectric layer 124 serves as sidewalls of the second recess 162 while the multiple work function metal layer 126 and the gap-filling metal layer 128 serve as a bottom of the second recess 162.

Figure 4:
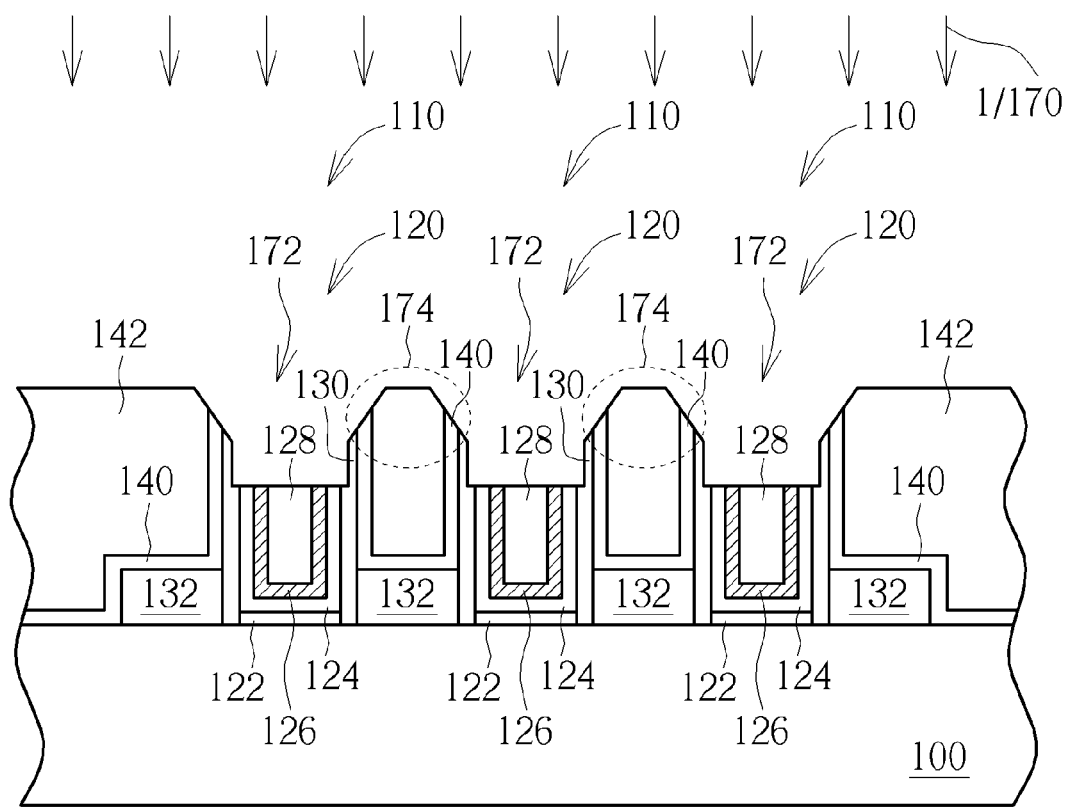

Please refer to FIG. 4. After forming the second recess 162, an insulating material etching process 170 is performed. The insulating material etching process 170 includes a dry etching process. For example, the insulating material etching process 170 includes $C_xH_yF_z$, but not limited to this. It is noteworthy that the insulating material etching process 170 and the metal etching process 10 (including the first metal etching step 150 and the second metal etching step 160) are performed in-situ, therefore the insulating material etching process 170, the first metal etching step 150, and the second metal etching step 160 are taken as three steps of one etching process 1. More important, the insulating material etching process 170 is performed to remove a portion of the insulating material, including the ILD layer 142, the CESL 140, the spacer 130, and the high-k gate dielectric layer 124. Consequently, a final recess 172 is obtained in the each transistor 110 and a tapered part 174, which is emphasized by the Circle in FIG. 4, of the insulating material is obtained. As shown in FIG. 4, an opening width of the final recess 172 is much larger than the opening width of the second recess 162 due to the tapered part 174 of the insulating material. Additionally, the spacer 130, the CESL 142, and the ILD layer 140 serve as sidewalls of the final recess 172, and the high-k gate dielectric layer 124, the multiple work function metal layer 126 and the gap-filling metal layer 128 serve as a bottom of the final recess 172. As shown in FIG. 4, as to the sidewalls of the final recess 172, a height of the ILD layer 142 is larger than a height of the CESL 140, and the height of the CESL 142 is larger than a height of the spacer 130 due to the tapered part 174 of the insulating material. Also, the opening width of the final recess 172 is much larger than the bottom itself.

Figure 5:
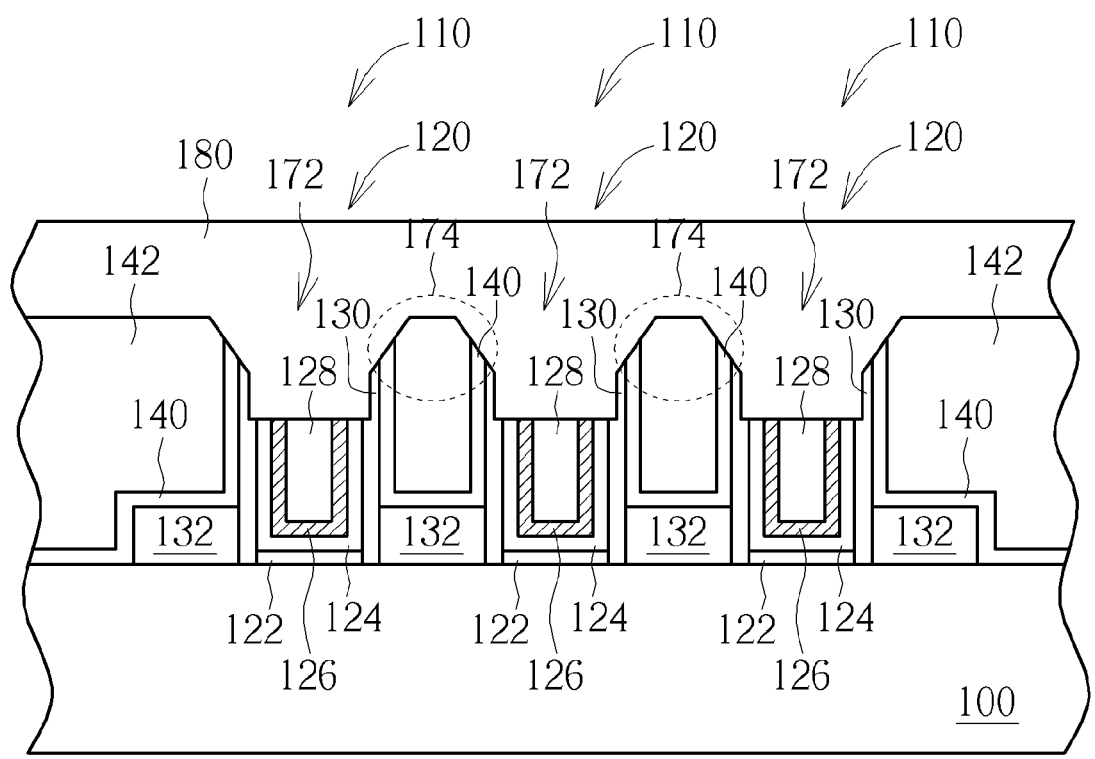

Please refer to FIG. 5. Next, a hard mask layer 180 is formed on the substrate 100. The hard mask layer 180 includes silicon nitride (hereinafter abbreviated as SiN), but not limited to this. It is noteworthy that the hard mask layer 180 fills up each final recess 172 are shown in FIG. 5.

Figure 6:
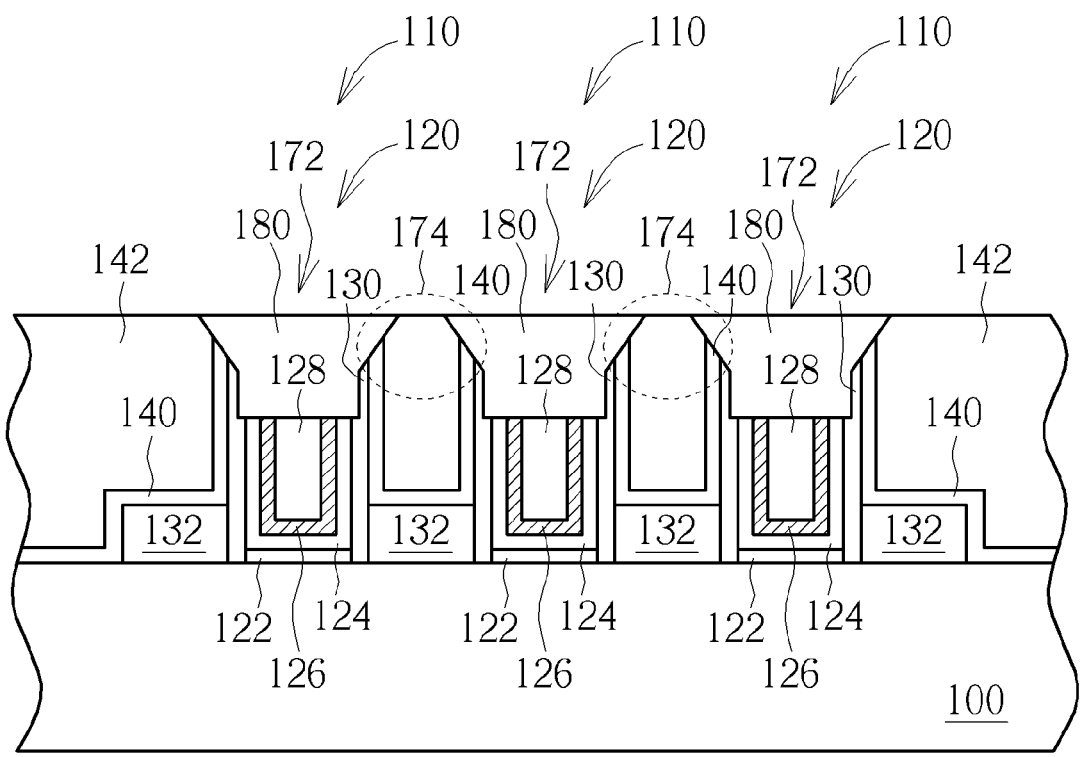

Please refer to FIG. 6. After forming the hard mask layer 180, a planarization process is performed. Consequently, the hard mask layer 180 is planarized and thus the hard mask layers 180 are remained on each top of the metal gate 120, which is shortened by the metal etch process 10. And an even surface formed of the hard mask layers 180 and the ILD layer 142 is obtained. As shown in FIG. 6, the hard mask layer 180 is remained not only on the metal gate 120, but also is formed on and in contact with the high-k gate dielectric layer 124, the spacer 130, the CESL 140, and the ILD 142.

According to the method for manufacturing the semiconductor device provided by the first preferred embodiment, the final recess 172 and the tapered part 174 of the insulating material are formed by the etching process 1. More important, the final recess 172 includes an opening much larger than the bottom itself due to the tapered part 174 of the insulating material. Therefore, the hard mask layer 180 subsequently formed to fill up the final recess 172 inheritably obtains a width larger than a width of the metal gate 120.

Figure 7:
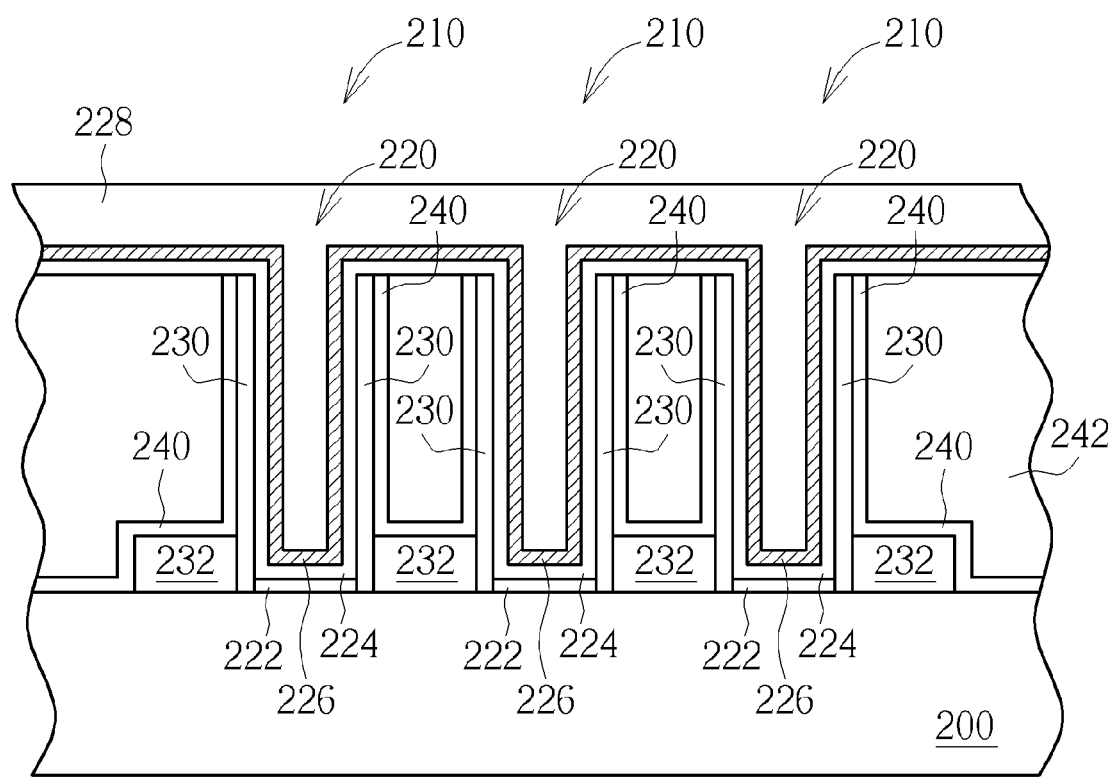

Please refer to FIGS. 7-12, which are schematic drawings illustrating a method for manufacturing a semiconductor device provided by a second preferred embodiment of the present invention. It is noteworthy that elements the same in both of the first and second preferred embodiments can include the same material, and thus those details are omitted hereinafter in the interest of brevity. As shown in FIG. 7, the preferred embodiment first provides a substrate 200, and a plurality of transistors 210 are formed on the substrate 200. The transistors 210 respectively include a dummy gate (not shown), light doped drains (not shown), a spacer 230, and a source/drain 232. Salicides (not shown) can be formed on the source/drain 232. Additionally, selective strain scheme is involved in the preferred embodiment. As shown in FIG. 7, a SEG method is performed to form an epitaxial source/drain 232. The epitaxial source/drain 232 can include SiGe or SiC, depending on the conductivity type of the transistor 110. Also, a CESL 240 and an ILD layer 242 are formed on the substrate 200. It should be easily realized that since the ILD layer 242, the CESL 240, and the spacer 230 are all formed of insulating material, the ILD layer 242, the CESL 240, and the spacer 230 are taken as an insulating material in which the transistors 210 are embedded.

It is well-known to those skilled in the art that in the gate-last process, the dummy gate are removed and thus a gate trench (not shown) is formed in each transistor 210. Additionally, an IL layer 222 is exposed in a bottom of the gate trench. Next, a high-k gate dielectric layer 224, a multiple work function metal layer 226, and a gap-filling metal layer 228 are sequentially formed on the substrate 200. As mentioned above, the multiple work function metal layer 226 includes at least a work function metal layer, which provides work function required by the transistor 210. For example, when the transistor 210 is a p-typed transistor, the work function metal layer 106 is a p-metal layer with a work function between 4.8 and 5.2. On the other hand, when the transistor 210 is an n-typed transistor, the work function metal layer is an n-metal layer with a work function between 3.9 and 4.3. The multiple work function metal layer 226 can also include any conductive material required in the metal gate approach, such as a barrier layer and/or an etch stop layer, but not limited to this. The gap-filling metal layer 228 including metal material having superior gap-filling ability is formed to fill up each gate trench.

After forming the gap-filling metal layer 228, a planarization process is performed. It is noteworthy that in the preferred embodiment, the planarization process stops at the gap-filling metal layer 228 as shown in FIG. 7. Therefore, a metal gate 220 is formed in each transistor 220 and those metal gates 220 are connected to each other by the gap-filling metal layer 228 as shown in FIG. 7. In other words, the gap-filling metal layer 228 entirely covers a surface of the insulating material (including the ILD layer 242, the CESL 240, and the spacer 230), and the multiple work function metal layer 226 and the high-k gate dielectric layer 224 are formed between the gap-filling metal layer 228 and the insulating material.

Figure 8:
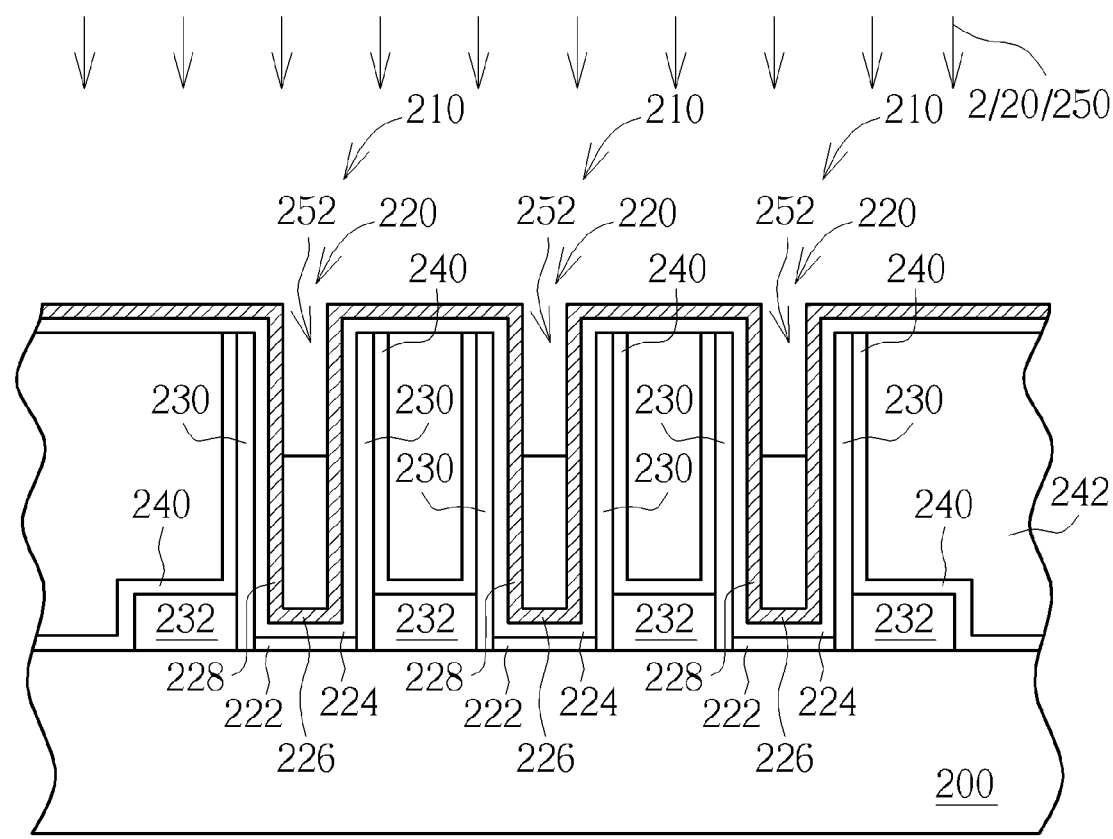

Please refer to FIG. 8. Next, a first metal etching step 250 is performed to remove a portion of the gap-filling metal layer 228, and thus a first recess 252 is formed in each transistor 210. The first metal etching step 250 includes a dry etching process. For example, the first metal etching step 250 includes $Cl_2$ and $SF_6$, but not limited to this. It is noteworthy that the first metal etching step 250 stops at a surface of the multiple work function metal layer 226. In other words, the multiple work function metal layer 226 serves as an etch stop layer in the first metal etching step 250. Therefore, layers covered by the multiple work function metal layer 226 are protected from damages caused in the first metal etching step 250. As shown in FIG. 8, the multiple work function metal layer 226 serves as sidewalls of the recess 252 and the gap-filling metal layer 228 serves as a bottom of the recess 252.

Figure 9:
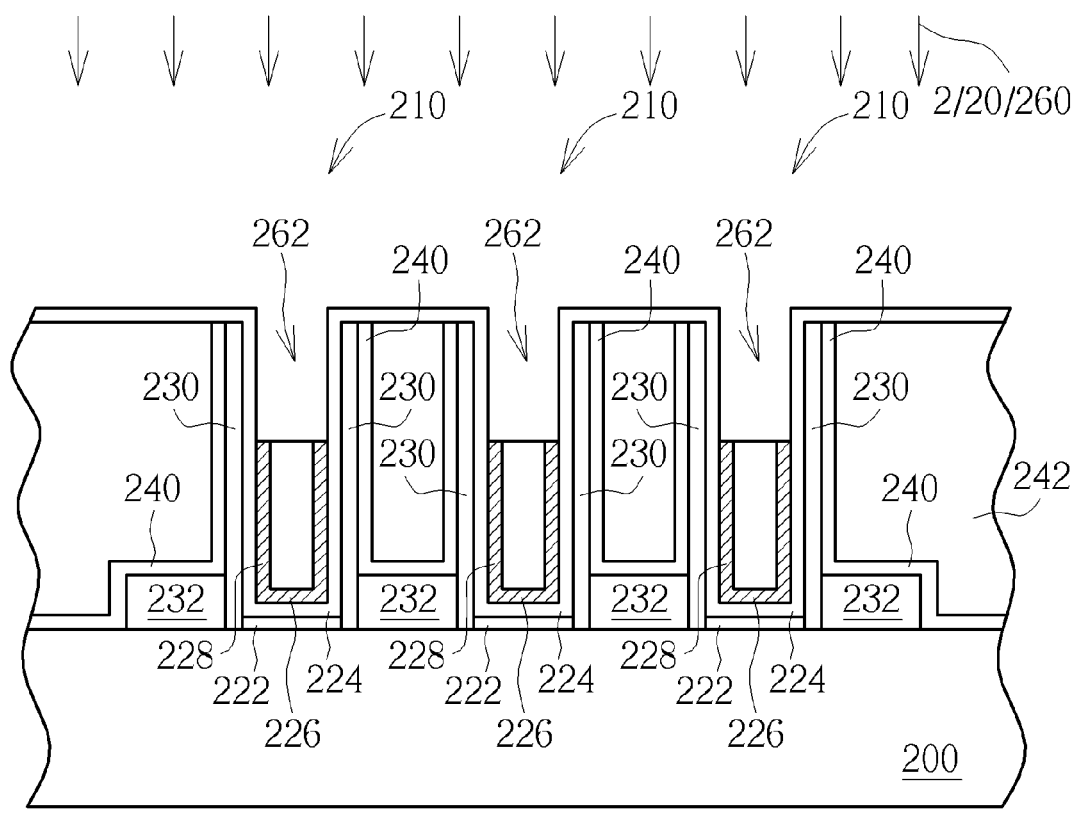

Please refer to FIG. 9. After forming the first recess 252, a second metal etching step 260 is performed to remove a portion of the multiple work function metal layer 226, and thus a second recess 262 is formed in each transistor 210. The second metal etching step 260 includes a dry etching process. For example, the second metal etching step 260 includes $Cl_2$ and $BCl_3$, but not limited to this. It is noteworthy that the first metal etching step 250 and the second metal etching step 260 are performed in-situ, therefore the first metal etching step 250 and the second metal etching step 260 are taken as two steps of one metal etching process 20. More important, since the multiple work function metal layer 126 serves as the sidewalls of the first recess 252, the second recess 262 is formed as to widen the first recess 252 by the second metal etching step 260. Consequently, an opening width of the second recess 262 is larger than an opening width of the first recess 252. It is also noteworthy that the second metal etching step 260 stops at a surface of the high-k gate dielectric layer 224. In other words, the high-k gate dielectric layer 224 serves as an etch stop layer in the second metal etching step 260. Therefore, layers covered by the high-k gate dielectric layer 224 are protected from damages caused in the second metal etching step 260. As shown in FIG. 9, the high-k gate dielectric layer 224 serves as sidewalls of the second recess 262, and the multiple work function metal layer 226 and the gap-filling metal layer 228 serve as a bottom of the second recess 262.

Figure 10:
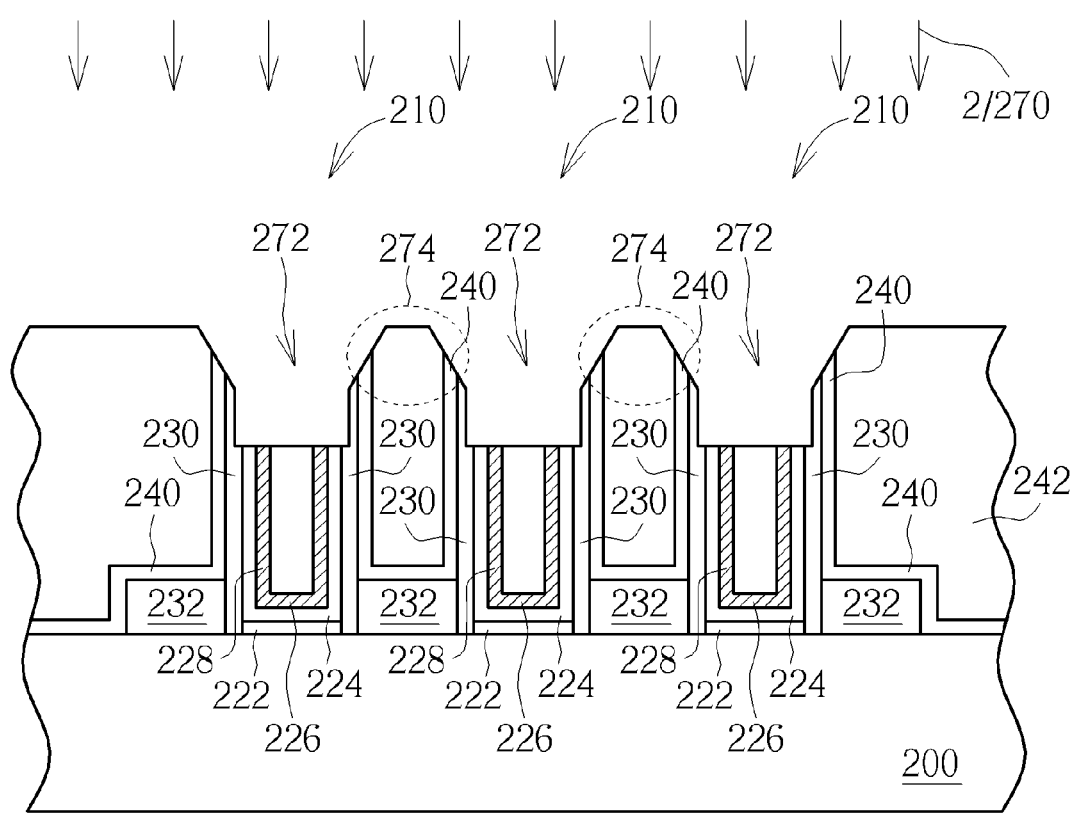

Please refer to FIG. 10. After forming the second recess 262, an insulating material etching process 270 is performed. The insulating material etching process 270 includes a dry etching process. For example, the insulating material etching process 270 includes $C_xH_yF_z$, but not limited to this. It is noteworthy that the insulating material etching process 270 and the metal etching process 20 (including the first metal etching step 250 and the second metal etching step 260) are performed in-situ, therefore the insulating material etching process 270, the first metal etching step 250, and the second metal etching step 260 are taken as three steps of one etching process 2. More important, the insulating material etching process 270 is performed to remove a portion of the insulating material, including the ILD layer 242, the CESL 240, the spacer 230, and the high-k gate dielectric layer 224. Consequently, a final recess 272 is obtained in the each transistor 210 and a tapered part 274, which is emphasized by the Circle in FIG. 10, of the insulating material is obtained. As shown in FIG. 10, an opening width of the final recess 272 is much larger than the opening width of the second recess 262 due to the tapered part 274 of the insulating material. Additionally, the spacer 230, the CESL 242, and the ILD layer 240 serve as sidewalls of the final recess 272, and the high-k gate dielectric layer 224, the multiple work function metal layer 226 and the gap-filling metal layer 228 serve as a bottom of the final recess 272. As shown in FIG. 10, as to the sidewalls of the final recess 272, a height of the ILD layer 242 is larger than a height of the CESL 240, an the height of the CESL 242 is larger than a height of the spacer 230 due to the tapered part 274 of the insulating material. Also, the opening width of the final recess 172 is much larger than the bottom itself. Also, the opening width of the final recess 272 is much larger than the bottom itself.

Figure 11:
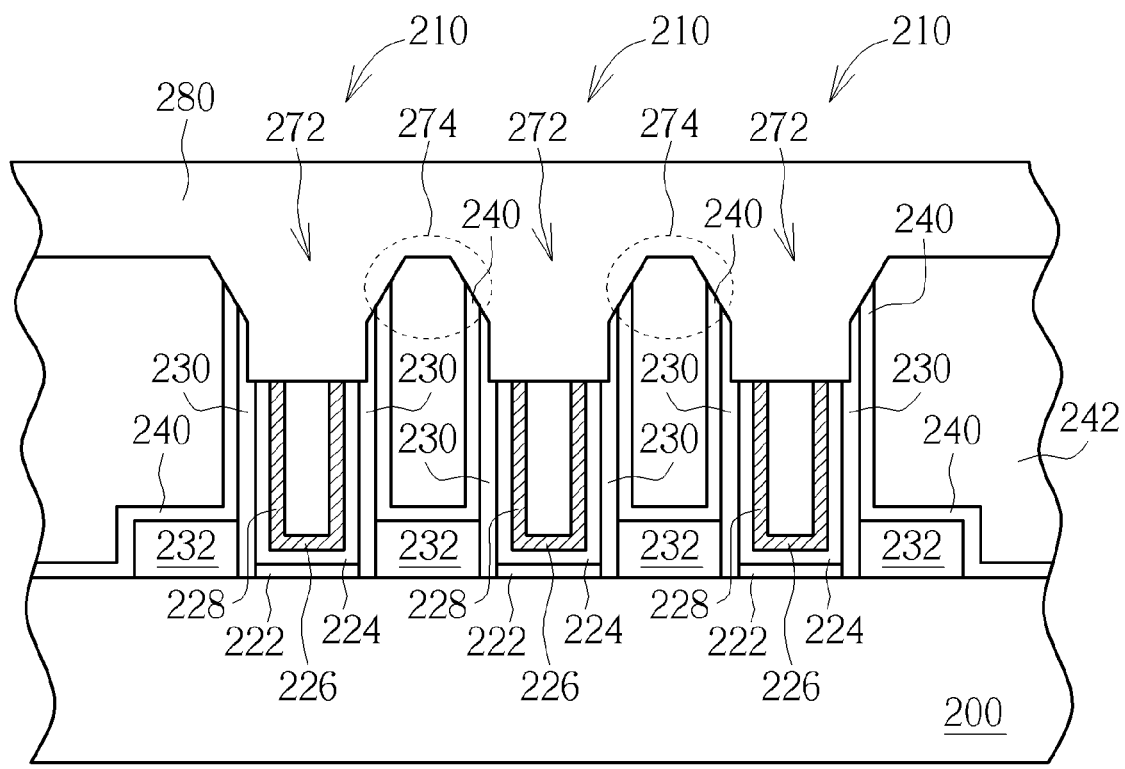

Please refer to FIG. 11. Next, a hard mask layer 280 is formed on the substrate 200. As mentioned above, the hard mask layer 280 includes SiN, but not limited to this. It is noteworthy that the hard mask layer 280 fills up each final recess 272 are shown in FIG. 11.

Figure 12:
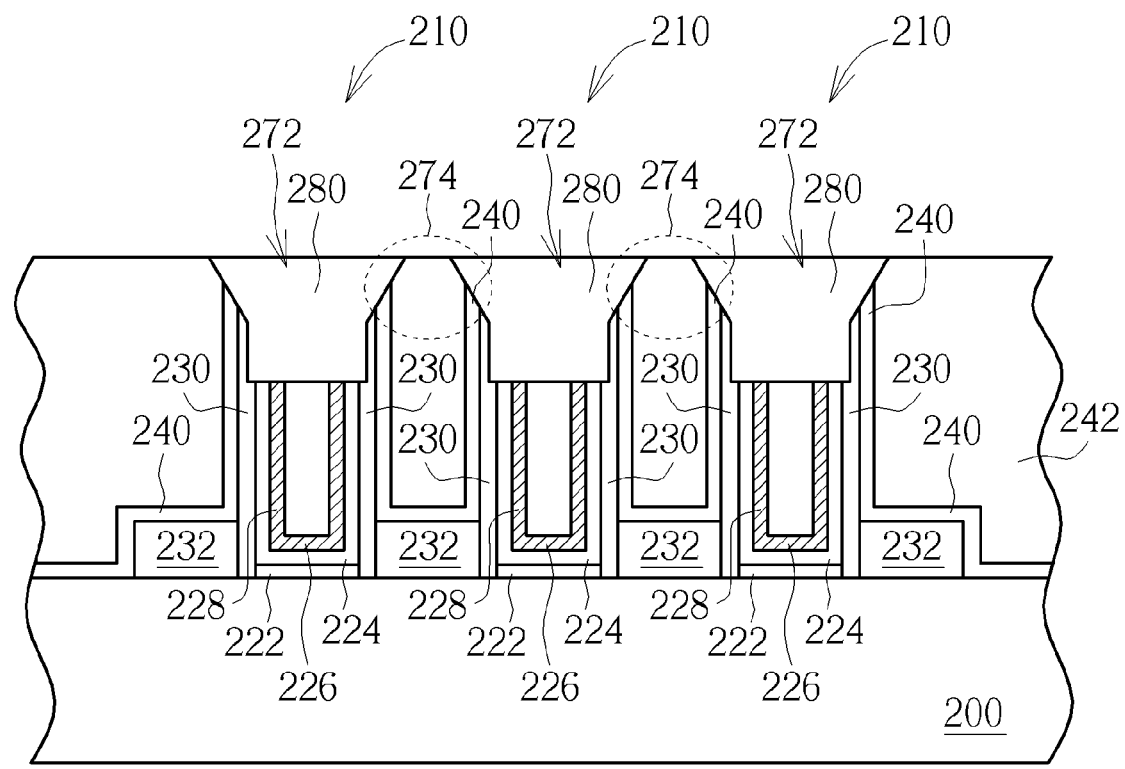

Please refer to FIG. 12. After forming the hard mask layer 280, a planarization process is performed. Consequently, the hard mask layer 280 is planarized and thus the hard mask layers 280 are remained on each top of the metal gate 220, which is shortened by the metal etch process 20. And an even surface formed of the hard mask layers 280 and the ILD layer 242 is obtained. As shown in FIG. 12, the hard mask layer 280 is remained not only on the metal gate 220, but also is formed on and in contact with the high-k gate dielectric layer 224, the spacer 230, the CESL 240, and the ILD 242.

According to the method for manufacturing the semiconductor device provided by the first preferred embodiment, the final recess 272 and the tapered part 274 of the insulating material are formed by the etching process 2. More important, the final recess 272 includes an opening much larger than the bottom itself due to the tapered part 274 of the insulating material. Therefore, the hard mask layer 280 subsequently formed to fill up the final recess 272 inheritably obtains a width larger than a width of the metal gate 220. More important, since the multiple work function metal layer 226 serves as the etch stop layer in the first metal etching step 250, and the high-k gate dielectric layer 224 serves as the etch stop layer in the second metal etching step 260, the profile of the final recess 272 can be more easily and precisely controlled.

According to the method for manufacturing the semiconductor device provided by the present invention, the recess and the tapered part of the insulating material are formed by the etching process. More important, the recess includes an opening larger than a bottom itself due to the tapered part of the insulating material. Therefore, the hard mask layer subsequently formed to fill the recess obtains a width larger than a width of the metal gate. Therefore the metal gate is protected from being exposed in following process such as contact hole etch process. Consequently, short circuit between the metal gate and the source/drain caused by contact plug misalign or contact plug shift is avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor device, comprising:
    providing a substrate having at least a transistor embedded in an insulating material formed thereon, the transistor comprising a metal gate and the insulating material comprising at least a spacer, a contact etch stop layer (CESL) and an inter-layer dielectric (ILD) layer;
    performing an etching process to remove a portion of the metal gate to form a recess and to remove a portion of the spacer, a portion of the CESL and a portion of the ILD layer to form a tapered part, wherein the metal gate is exposed at a bottom of the recess and the tapered part is formed on a top of the recess;
    forming a hard mask layer on the substrate to fill up the recess; and
    planarizing the hard mask layer.

2. The method for manufacturing the semiconductor device according to claim 1, wherein the etching process comprises at least a dry etching process.

3. The method for manufacturing the semiconductor device according to claim 1, wherein the metal gate comprises at least a gap-filling metal layer, a multiple work function metal layer, and a high dielectric constant (high-k) gate dielectric layer.

4. The method for manufacturing the semiconductor device according to claim 3, wherein the etching process further comprises:

performing a metal etching process to remove a portion of the gap-filling metal layer and the multiple work function metal layer; and
    performing an insulating material etching process to remove the portion of the ILD layer, the CESL and the spacer.

5. The method for manufacturing the semiconductor device according to claim 4, wherein the insulating material etching process comprises $C_xH_yF_z$.

6. The method for manufacturing the semiconductor device according to claim 4, wherein the metal etching process and the insulating material etching process are performed in-situ.

7. The method for manufacturing the semiconductor device according to claim 4, wherein the metal etching process further comprises:

performing a first metal etching step to remove a portion of the gap-filling metal layer; and
    performing a second metal etching step to remove a portion of the multiple work function metal layer.

8. The method for manufacturing the semiconductor device according to claim 7, wherein the gap-filling metal layer entirely covers a surface of the ILD layer, the CESL and the spacer of the insulating material, and the multiple work function metal layer and the high-k dielectric layer are formed between the gap-filling metal layer and the insulating material.

9. The method for manufacturing the semiconductor device according to claim 8, wherein the first metal etching step stops at a surface of the multiple work function metal layer.

10. The method for manufacturing the semiconductor device according to claim 8, wherein the second metal etching step stops at a surface of the high-k dielectric layer.

11. The method for manufacturing the semiconductor device according to claim 7, wherein the first metal etching step and the second metal etching step are performed in-situ.

12. The method for manufacturing the semiconductor device according to claim 7, wherein the first metal etching step comprises $Cl_2$ and $SF_6$.

13. The method for manufacturing the semiconductor device according to claim 7, wherein the second metal etching step comprises $Cl_2$ and $BCl_3$.

* * * * *